United States Patent [19]

Amazawa et al.

[11] Patent Number: 4,701,715
[45] Date of Patent: Oct. 20, 1987

[54] PRECEDING VALUE HOLDING GATE CIRCUIT FOR ELIMINATING PULSIVE NOISES

[75] Inventors: Kiyoshi Amazawa; Akira Mori, both of Tokyo, Japan

[73] Assignee: Clarion Co., Ltd., Tokyo, Japan

[21] Appl. No.: 937,259

[22] Filed: Dec. 3, 1986

[30] Foreign Application Priority Data

Dec. 5, 1985 [JP] Japan .............................. 60-272495

[51] Int. Cl.$^4$ .......................... H03B 1/04; H04B 1/10
[52] U.S. Cl. .................................. 328/165; 307/520; 307/542; 307/549; 455/312
[58] Field of Search ...................... 328/165, 163, 162; 307/520, 542, 549; 455/223, 312, 296

[56] References Cited

U.S. PATENT DOCUMENTS

| | | | |
|---|---|---|---|
| 4,246,441 | 1/1981 | Sugai et al. .......................... | 455/223 |
| 4,268,793 | 5/1981 | Amazawa et al. ................... | 328/163 |
| 4,331,885 | 5/1982 | Amazawa et al. ................... | 307/542 |
| 4,555,669 | 11/1985 | Namiki ................................ | 328/165 |
| 4,577,161 | 3/1986 | Hirohashi et al. ................... | 328/165 |

FOREIGN PATENT DOCUMENTS 0035837  2/1985  Japan .................................. 455/223

Primary Examiner—Stanley D. Miller
Assistant Examiner—Trong Q. Phan
Attorney, Agent, or Firm—Flynn, Thiel, Boutell & Tanis

[57] ABSTRACT

A gate circuit is configured to output a received signal via a buffer amplifier, enter the output in a storage capacitor via a first switching circuit normally taking its off-position, compare the signal levels at both ends of the switching circuit and feed back the comparison result to an input terminal via a second switching circuit normally taking its on-position, and configured so that when noise components in the received signal are detected, a control signal is produced to change the first switching circuit to its on-position and the second switching circuit to its off-position.

1 Claim, 3 Drawing Figures

PRECEDING VALUE HOLDING GATE CIRCUIT FOR ELIMINATING PULSIVE NOISES

FIELD OF THE INVENTION

This invention relates to a gate circuit used in an FM receiver, etc. to eliminate pulsive noises.

BACKGROUND OF THE INVENTION

A gate circuit of this type is called "preceding value holding gate circuit" and configured as shown in FIG. 3 in which if pulsive noises N are included in an input signal, a switching circuit is opened for a predetermined switching time T to remove the noises N, and the gate circuit supplies a signal having a level preceding the off-action of the switching circuit, so that the pulsive noises are never outputted from the gate circuit.

FIG. 2 shows an arrangement of a prior art gate circuit configured to supply such an output. Reference numeral 1 denotes an input terminal in which an input signal S is entered, 2 designates an output terminal, 3 refers to an input terminal to which a control signal is applied, 4 to a low output impedance buffer amplifier, 5 to a switching circuit normally taking its on-position, 6 to a high input impedance buffer amplifier, 7 to a preceding value holding capacitor, and 12 to a noise detector detecting noise components in the input signal S and producing a control signal.

With this arrangement, an input signal entered in the input terminal 1 is applied to the switching circuit 5 via the low output impedance buffer amplifier 4. The switching circuit 5 is controlled by a control signal supplied from the input terminal 3 and maintains its on-position unless pulsive noises exist. Therefore, the signal entered in the input terminal 1 is supplied from the output terminal 2 via the switching circuit 5 and the high input impedance buffer amplifier 6.

When pulsive noises are detected, the input terminal 3 receives a control signal and changes the switching circuit 5 to its off-position, and the noises are removed. Meanwhile, a voltage charged in the preceding value holding capacitor 7 is outputted via the buffer amplifier 6. Since the buffer amplifier 6 has a high input impedance, the electric charge stored in the capacitor 7 is not discharged, and the terminal voltage of the capacitor 7 is maintained at a uniform level.

While the switching circuit 5 takes its on-position, distortions produced in the gate circuit are determined by properties of respective buffer amplifiers 4, 6 and the switching circuit 5. Distortions produced in semiconductive elements in the amplifiers is decreased to a significantly small value by using as the amplifiers negative feedback amplifiers in which the gain is 1.

However, it is difficult to restrain distortions produced in semiconductive elements in the switching circuit 5, the distortions occupy a large part of the distortions produced in the switching circuit 5. Particularly, when the frequency of a signal entered in the gate circuit 5 increases, the high band frequency characteristic is detracted by a low pass filter formed by resistance components of the switching circuit 5 and the capacitor 7.

OBJECT OF THE INVENTION

According to the invention, there is provided a gate circuit comprising:

a buffer amplifier means connected between an input terminal and an output terminal;

a noise detecting means for detecting noise components in an input signal applied to said input terminal and producing a control signal;

a first switching means having one end connected to said output terminal and normally taking its on-position but changed to its off-position by said control signal from the noise detecting means;

a signal holding means connected to the other end of said first switching means;

a level comparator means for detecting a difference between signal levels at both ends of said first switching means; and a second switching means having one end connected to said input terminal and the other end connected to the output of said level comparator means and normally taking its off-position but changed to its on-position by said control signal.

With this arrangement, an output signal from the gate circuit is taken from the entrance of the first switching means, and the signal holding means is connected to the exit of the first switching means, so that the comparator means detects a difference between the levels at both ends of the first switching means to effect a negative feedback to the input of the gate circuit. Therefore, a distortion may occur only in the buffer amplifier means and in no other portion of the circuit, so that the distortion of the entire gate circuit is remarkably decreased.

DETAILED DESCRIPTION

Figure 1:
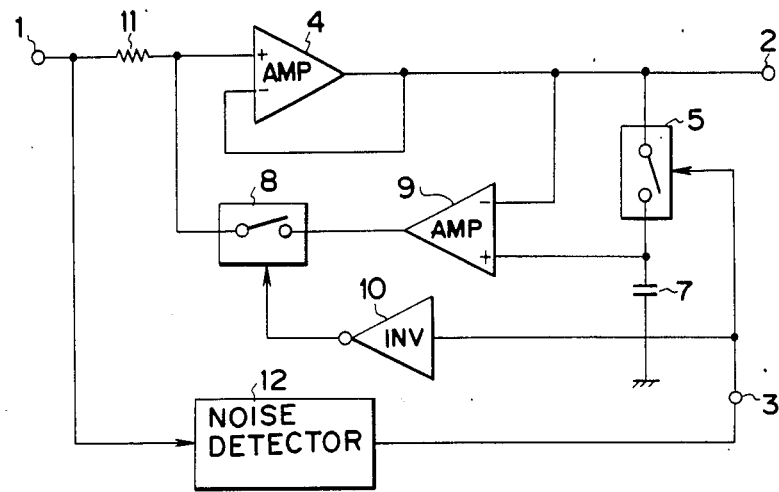
FIG. 1 shows an arrangement of a gate circuit embodying the invention.
Figure 2:
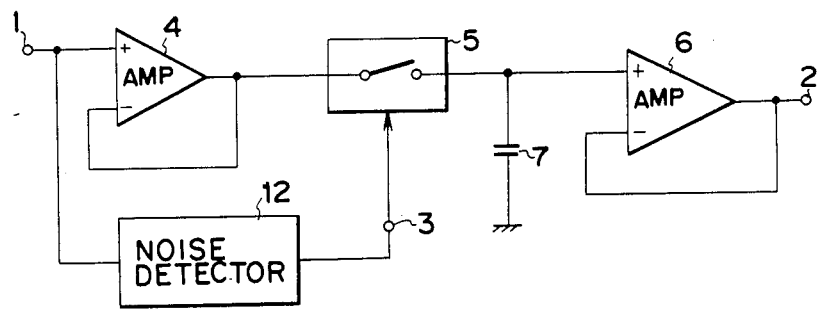
FIG. 2 is a circuit arrangement of a prior art gate circuit.
Figure 3:
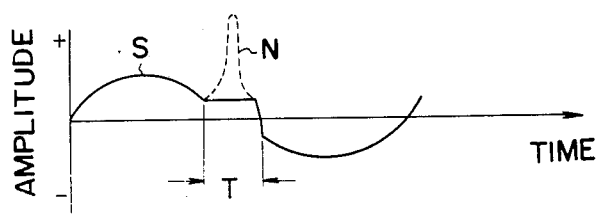
FIG. 3 shows an output waveform of the gate circuit.

FIG. 1 illustrate an embodiment of a gate circuit according to the invention, in which reference numeral 8 refers to a switching circuit normally taking its off-position, 9 to a high input impedance, high gain differential amplifier, 10 to an inverter, and 11 to a resistor.

In this embodiment, the resistor 11 and the buffer amplifier 4 are connected in series between the input terminal 1 and the output terminal 2. One end of the switching circuit 5 is connected between the buffer amplifier 4 and the output terminal 2, and the other end of the switching circuit 5 is connected to the capacitor 7. The (+) input terminal of the differential amplifier 9 is connected to the other end of the switching circuit 5, and the (−) input terminal of same is connected between the buffer amplifier 4 and the output terminal 2. The output of the differential amplifier 9 is connected to one end of the switching circuit 8 which has the other end connected between the resistor 11 and the buffer amplifier 4. The switching circuit 8 is controlled by an output from the inverter 10 which inverts the control signal from the input terminal 3.

With this arrangement, when the gate circuit effects a normal on-action, the switching circuit 5 takes its on-position, and the switching circuit 8 takes its off-position. In this configuration, an input signal entered in the input terminal 1 is applied to the buffer amplifier 4 via the resistor 11. In this case, since the buffer amplifier 4 has a high input impedance, and the switching circuit 8 takes its off-position, no signal loss by the resistor 11 occurs, and the signal entered in the buffer amplifier 4 is outputted in the original form to the output terminal 2.

The output of the buffer amplifier 4 changes the preceding value holding capacitor 7 via the switching circuit 5. Since the output impedance of the buffer amplifier 5 is low, the output signal from the buffer amplifier 4 is never influenced by a load current to the switching circuit 5. Therefore, the buffer amplifier 4 supplies the output terminal 2 with an output in the form of the signal at the input terminal 1.

When pulsive noises are detected, the control signal from the input terminal 3 changes the switching circuit 5 to its off-position and changes the switching circuit 8 to its on-position. The off-position of the switching circuit 5 causes the capacitor 7 to maintain a voltage (charge voltage) at a level preceding the off-action of the switching circuit 5. In this case, since the differential amplifier 9 has a high input impedance, the charge voltage of the capacitor 7 is maintained at a uniform level, and is never discharged.

The differential amplifier 9 amplifies the level difference between its (+) and (−) input terminals with reference to the level of the (+) input terminal, and controls the input of the buffer amplifier 4 via the switching circuit 8. More specifically, this control is effected by a negative feedback circuit made by (−) input terminal of the differential amplifier 9→ switching circuit 8→ buffer amplifier 4→ (−) input terminal of the differential amplifier 9, so as to increase the level at the (−) input terminal of the differential amplifier up to the signal level of the (+) input terminal.

At this time, the negative feedback loop gain exhibits a significantly high value due to the high gain of the differential amplifier 9. Therefore, also when the (−) input terminal of the differential amplifier 9 is different from the (+) input terminal level by a very small amount, the difference voltage is largely amplified to effect a strong feedback for correction of the (−) input terminal signal level.

As the result, whatever signal is entered in the input terminal 1, an output corresponding to the voltage of the capacitor 7 is obtained at the output terminal 2.

Therefore, the circuit produces an output not including pulsive noises and having a level held in the capacitor 7.

The resistor 11 is used here to prevent a loss of the output signal from the switching circuit 8 due to an impedance of the input signal source connected to the input terminal 1. In other words, the resistor 11 prevents a large drop of the feedback loop gain.

As will be understood from the aforegoing description, when the gate circuit is conductive, distortions of the circuit may be produced only in the buffer amplifier but in no other portion. Since the buffer amplifier may be a negative feedback amplifier of gain 1, distortions produced in semiconductive elements of the buffer amplifier can be reduced to a very small value, and the distortion characteristic of the entire circuit is remarkably improved.

In conclusion, the invention arrangement can remarkably decreases the distortion of the gate circuit, and never detracts the high frequency properties of the gate circuit.

What is claimed is:

1. A gate circuit comprising:
   a buffer amplifier means connected between an input terminal and an output terminal;
   a noise detecting means for detecting noise components in an input signal applied to said input terminal and producing a control signal;
   a first switching means having one end connected to said output terminal and normally taking its on-position but changed to its off-position by said control signal from the noise detecting means;
   a signal holding means connected to the other end of said first switching means;
   a level comparator means for detecting a difference between signal levels at both ends of said first switching means; and
   a second switching means having one end connected to said input terminal and the other end connected to the output of said level comparator means and normally taking its off-position but changed to its on-position by said control signal.

* * * * *